United States Patent [19]

Khong et al.

[11] Patent Number: 5,594,366

[45] Date of Patent: Jan. 14, 1997

[54] PROGRAMMABLE LOGIC DEVICE WITH REGIONAL AND UNIVERSAL SIGNAL ROUTING

[75] Inventors: James C. K. Khong, San Jose; Wendey E. Mueller, Fremont; Joe Yu, Palo Alto; Neal Berger, Cupertino; Keith H. Gudger, Soquel; Geoffrey S. Gongwer, Campbell, all of Calif.

[73] Assignee: Atmel Corporation, San Jose, Calif.

[21] Appl. No.: 492,390

[22] Filed: Jun. 19, 1995

Related U.S. Application Data

[63] Continuation of Ser. No. 238,156, May 4, 1994, abandoned.

[51] Int. Cl.⁶ .......................... H01L 25/00; H03K 19/177
[52] U.S. Cl. .......................... 326/41; 326/39; 340/825.87
[58] Field of Search ................................. 326/41, 47, 39; 327/407; 340/825.85, 825.87

[56] References Cited

U.S. PATENT DOCUMENTS

| | | | |
|---|---|---|---|
| Re. 34,363 | 8/1993 | Freeman | 307/465 |
| 3,925,684 | 12/1975 | Gaskill, Jr. et al. | 307/203 |
| 4,422,072 | 12/1983 | Cavlan | 340/825.87 |
| 4,642,487 | 2/1987 | Carter | 307/465 |
| 4,670,749 | 6/1987 | Freeman | 340/825.85 |
| 4,758,745 | 7/1988 | Elgamal et al. | 307/465 |
| 4,855,619 | 8/1989 | Hsieh et al. | 307/443 |
| 4,871,930 | 10/1989 | Wong et al. | 307/465 |
| 4,873,459 | 10/1989 | El Gamal et al. | 307/465 |
| 4,903,223 | 2/1990 | Norman et al. | 364/716 |
| 4,910,417 | 3/1990 | El Gamal et al. | 307/465 |
| 4,912,342 | 3/1990 | Wong et al. | 307/465 |
| 4,945,267 | 7/1990 | Galbraith | 307/571 |
| 4,967,107 | 10/1990 | Kaplinsky | 307/465 |
| 4,969,121 | 11/1990 | Chan et al. | 364/900 |
| 5,015,885 | 5/1991 | El Gamal et al. | 307/465 |
| 5,055,718 | 10/1991 | Galbraith et al. | 307/465 |
| 5,075,576 | 12/1991 | Cavlan | 307/465 |
| 5,079,451 | 1/1992 | Gudger et al. | 307/465.1 |
| 5,122,685 | 6/1992 | Chan et al. | 307/465.1 |
| 5,140,193 | 8/1992 | Freeman et al. | 307/465 |
| 5,144,166 | 9/1992 | Camarota et al. | 307/465.1 |
| 5,172,014 | 12/1992 | El Ayat et al. | 307/465 |
| 5,187,393 | 2/1993 | El Gamal et al. | 307/465.1 |
| 5,189,320 | 2/1993 | Gongwer | 307/465 |
| 5,198,705 | 3/1993 | Galbraith et al. | 307/465 |

(List continued on next page.)

OTHER PUBLICATIONS

Chen, X. et al. "Algebraic means" *IEEE Proc.*, vol. 128, Pt. E, No. 5, Sep. 1981, pp. 205–209.

Chen, X. et al., "A Comparison of Universal–Logic–Module Realizations and Thier Application in the Synthesis of Combinatorial and Sequential Logic Networks", *IEEE Transactions of Computers*, vol. C–31, No. 2, Feb. 1982, pp. 140–147.

Edwards, C. R. et al., "Research note, an analysis of universal logic modules", *Int. J. Electronics*, vol. 41, No. 6, 1976, pp. 625–628.

M. Morris Mano, *Computer Engineering —Hardware Design*, 1988, p. 68.

*Primary Examiner*—Edward P. Westin
*Assistant Examiner*—Stephen Calogero
*Attorney, Agent, or Firm*—Thomas Schneck

[57] ABSTRACT

A programmable logic device having a plurality of logic cells arranged in groups defining separate logic regions, both regional and multi-regional bus lines, and a crosspoint switch matrix which serves only to route signals from bus lines to inputs of the logic cells without logically combining two or more of the bus signals, i.e. without forming product terms. Rather, all logic is carried out by the logic cells themselves. In particular, the switch matrix is constructed so that each bus line can connect to one or more logic cell inputs, but each logic cell input can meaningfully connect to only one bus line without shorting. In one embodiment, each logic cell feeds one logic signal back to a regional bus line and can potentially feed back another logic signal through its region's universal select matrix to a universal bus line. The select matrix connects a subset of the region's potential feedback signals to the universal bus.

9 Claims, 4 Drawing Sheets

U.S. PATENT DOCUMENTS

| | | | |
|---|---|---|---|
| 5,208,491 | 5/1993 | Ebeling et al. | 307/465 |
| 5,220,213 | 6/1993 | Chan et al. | 307/465 |
| 5,220,214 | 6/1993 | Pedersen | 307/465 |
| 5,231,312 | 7/1993 | Gongwer et al. | 307/465 |
| 5,255,203 | 10/1993 | Agrawal et al. | 364/489 |
| 5,258,668 | 11/1993 | Cliff et al. | 307/465 |
| 5,260,610 | 11/1993 | Pederson et al. | 307/465 |
| 5,260,611 | 11/1993 | Cliff et al. | 307/465 |
| 5,296,759 | 3/1994 | Sutherland | 307/465.1 |
| 5,329,181 | 7/1994 | Ridgeway | 307/465 |
| 5,331,227 | 7/1994 | Hawes | 307/465 |

PROGRAMMABLE LOGIC DEVICE WITH REGIONAL AND UNIVERSAL SIGNAL ROUTING

This is a continuation of application Ser. No. 08/238,156 filed on May 4, 1994, now abandoned.

TECHNICAL FIELD

The present invention relates to integrated circuits of the type known as programmable logic devices and in particular relates to interconnection layouts or architectures which improve overall functional flexibility of such devices.

BACKGROUND ART

In U.S. Pat. No. 5,079,451, Gudger et al. describe a programmable logic device (PLD) having global and local buses providing product terms to a plurality of logic cells. The global bus is capable of communicating with all of the logic cells, while each of the local buses is capable of communicating with only some of the logic cells in the device. Global and local product term signals are produced by AND matrices that are structurally integral with the buses. That is, programmable AND matrices appear as a set of programmable interconnections located where product term lines (logic cell inputs) cross bus lines in the global and local buses. The crosspoint matrices formed by the bus lines, logic cell inputs and programmable interconnections are thus a logic element, essentially a set of wide fan-in AND gates, where the bus lines form the gate inputs and the logic cell inputs form the gate outputs. The logic cells, with their OR gates receiving the resulting product term signals on the logic inputs, form a second level of logic producing sum-of-products terms.

Field programmable gate arrays (FPGAs) typically have a topology where logic blocks are arranged in a two-dimensional array consisting of rows and columns of logic blocks and where interconnect resources occupy the space between the rows and columns. These interconnects form a crosspoint switch matrix that acts to route signals from outputs of the blocks to inputs of the blocks. The interconnect matrix is usually constructed so that signals are potentially routable to all of the logic blocks in the device. However, each logic block input is only connected to one bus line in the interconnect structure.

In U.S. Pat. No. 5,208,491, Ebeling et al. describe a FPGA having a checkerboard array of intermeshed forwardly propagating and backwardly propagating routing and logic blocks (FPRLBs and BPRLBs). A plurality of forwardly propagating and back propagating vertical segmented routing channels (FPSRCs and BPSRCs) serve as signal bus lines between adjacent columns of RLBs. Each FPRLB (or BPRLB) receives an input signal from an immediately adjacent FPSRC (or BPSRC) in one vertical channel and transmits an output signal to another immediately adjacent FPSRC (or BPSRC) in the opposite vertical channel. The individual bus lines in the FPSRCs and BPSRCs are segmented into different lengths allowing short, medium and long range communication with the FPRLBs and BPRLBs.

An object of the present invention is to improve the functional flexibility of programmable logic devices (PLDs) by incorporating some of the interconnection features that presently are found only on FPGAs.

SUMMARY OF THE INVENTION

The object is met with a programmable logic device having a plurality of logic cells arranged in separate logic regions, a plurality of bus lines, including both regional and multi-regional bus lines, and a crosspoint switch matrix which only serves to route signals from bus lines to the inputs of the logic cells without logically combining the bus signals to form product terms at those inputs. In the PLD's switch matrix, each bus line can connect to more than one logic cell input, but each logic cell input can meaningfully connect to only one bus line without shorting. In a preferred embodiment, each logic cell can feed back one logic signal to a regional bus line and can potentially feedback another logic signal through a universal select matrix to a multi-regional or universal bus line. One universal select matrix is provided for each region of logic cells to select a subset of the potential feedback signals for connection to the universal bus.

BRIEF DESCRIPTION OF THE DRAWINGS

FIG. 3b is the feedback select portion of this logic cell and is connected to the combinatorial signal line E, the register output Q and the I/O pin in FIG. 3a.

BEST MODE OF CARRYING OUT THE INVENTION

Figure 1:
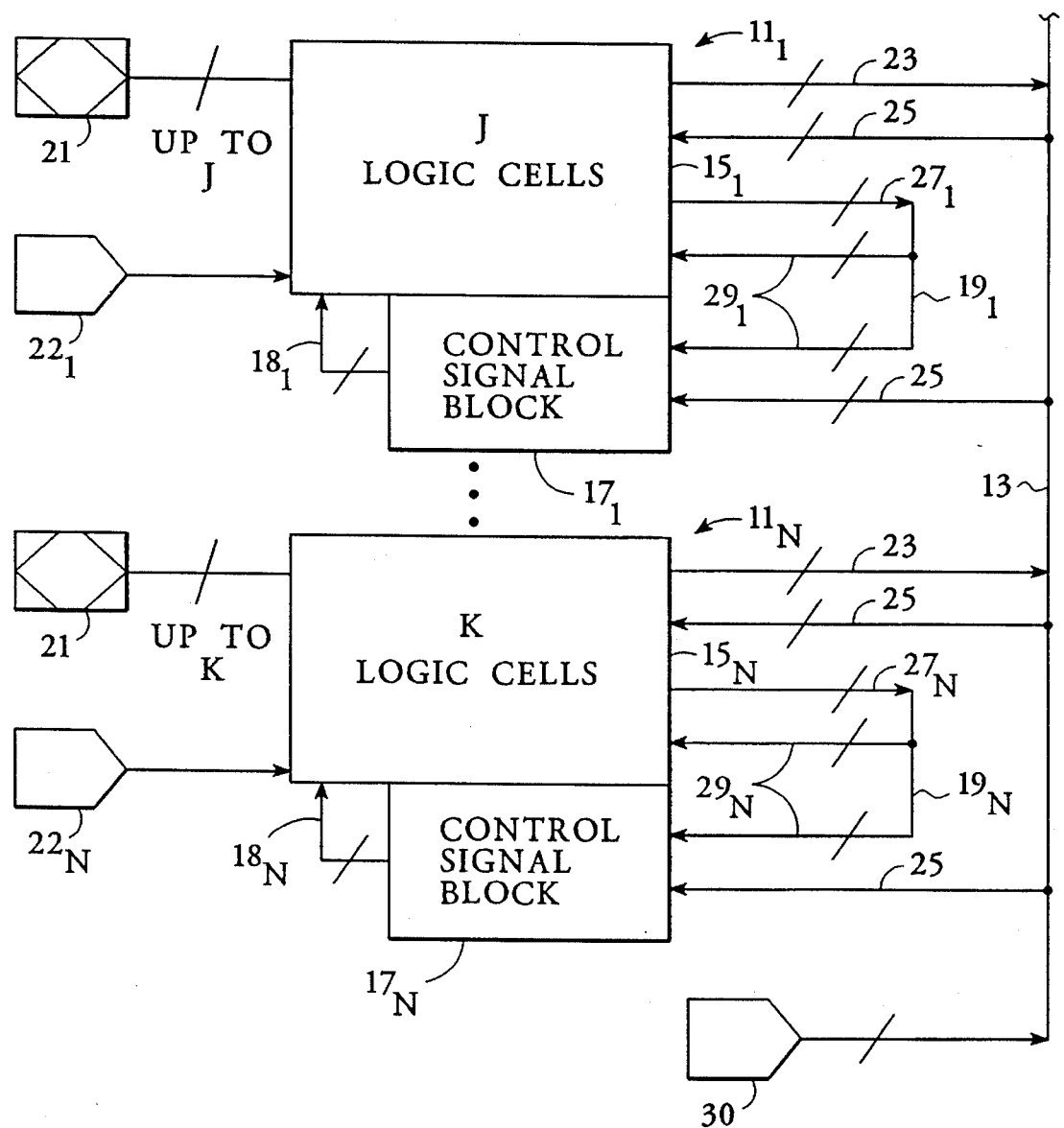
FIG. 1 is a block diagram showing the chip-level architecture of an ultra programmable logic device (ultra PLD) of the present invention.

With reference to FIG. 1, an ultra programmable logic device (ultra PLD) of the present invention, seen in its topmost chip-level architecture, has plurality of N separate logic regions $11_1$–$11_N$ interconnected by a common universal signal bus 13. Typically, the ultra PLD has four to eight logic regions ($4 \leq N \leq 8$), but the number N of logic regions is not absolutely critical. In turn, each logic region has a group of logic cells $15_1$–$15_N$, a circuit block $17_1$–$17_N$ for generating regional control signals, and a region signal bus $19_1$–$19_N$. The number J, K, etc. of logic cells in each group $15_1$–$15_N$ of such cells, i.e., the number of logic cells in each logic region $11_1$–$11_N$, is typically about 20, but this number is not critical and need not be the same for every logic region in a given device. For example, the number J of logic cells $15_1$ in logic region $11_1$ may be twenty (J=20), while the number K of logic cells $15_N$ in logic region $11_N$ may be twenty-four (K=24), while still other logic regions may contain groups of fifteen, sixteen, eighteen, or some other number of logic cells. In some devices, each logic cell in the device or each logic cell in a given region is an input/output (I/O) macrocell associated with a specific I/O pin 21, while in other devices, some logic cells in at least one region $11_1$–$11_N$ may be buried and have no associated I/O pin. In all cases, the number of I/O pins 21 for each logic region $11_1$–$11_N$ equals the number of I/O macrocells in that region and never exceeds the total number of all logic cells $15_1$–$15_N$ for that region. Thus, logic region $11_1$ with its J logic cells has up to J associated I/O pins 21, equal to the number of I/O macrocells in the group of logic cells $15_1$ for that region. Each regional control signal generating circuit block $17_1$–$17_N$ provides a number of control signals, such as output enable and asynchronous reset signals, on regional control lines $18_1$–$18_N$ to the logic cells $15_1$–$15_N$ for its particular region $11_1$–$11_N$. Other control signals, such as regional clock signals, may be provided by dedicated clock pins $22_1$–$22_N$.

The universal signal bus 13 receives a set of feedback signals on lines 23 from the logic cells $15_1$–$15_N$ of each logic region $11_1$–$11_N$ and provides common input signals on input lines 25 to the logic cells $15_1$–$15_N$ and control signal generating circuit blocks $17_1$–$17_N$ of all regions $11_1$–$11_N$. Input-only pins 30 may also supply signals to the universal bus 13. The N separate regional signal buses $19_1$–$19_N$ receive regional feedback signals on regional feedback lines $27_1$–$27_N$ from the logic cells $15_1$–$15_N$ of the corresponding logic regions $11_1$–$11_N$ and provide separate sets of regional input signals on input lines $29_1$–$29_N$ to the logic cells $15_1$–$15_N$ and control signal generating circuit blocks $17_1$–$17_N$ within the corresponding logic regions $11_1$–$11_N$. It should be noted that while the universal and regional feedback lines 23 and $27_1$–$27_N$ are generally entirely distinct from one another, the input lines 25 and $29_1$–$29_N$ may programmably connect to either the universal bus 13 or one of the regional buses $19_1$–$19_N$. Thus, whether an input line carries a common input signal from the universal bus 13, and thus may be considered a universal input line 25, or carries a regional input signal from a regional bus $19_1$–$19_N$, and thus may be considered a regional input line $29_1$–$29_N$, can depend on the actual programmed connections within a particular device.

Figure 2:
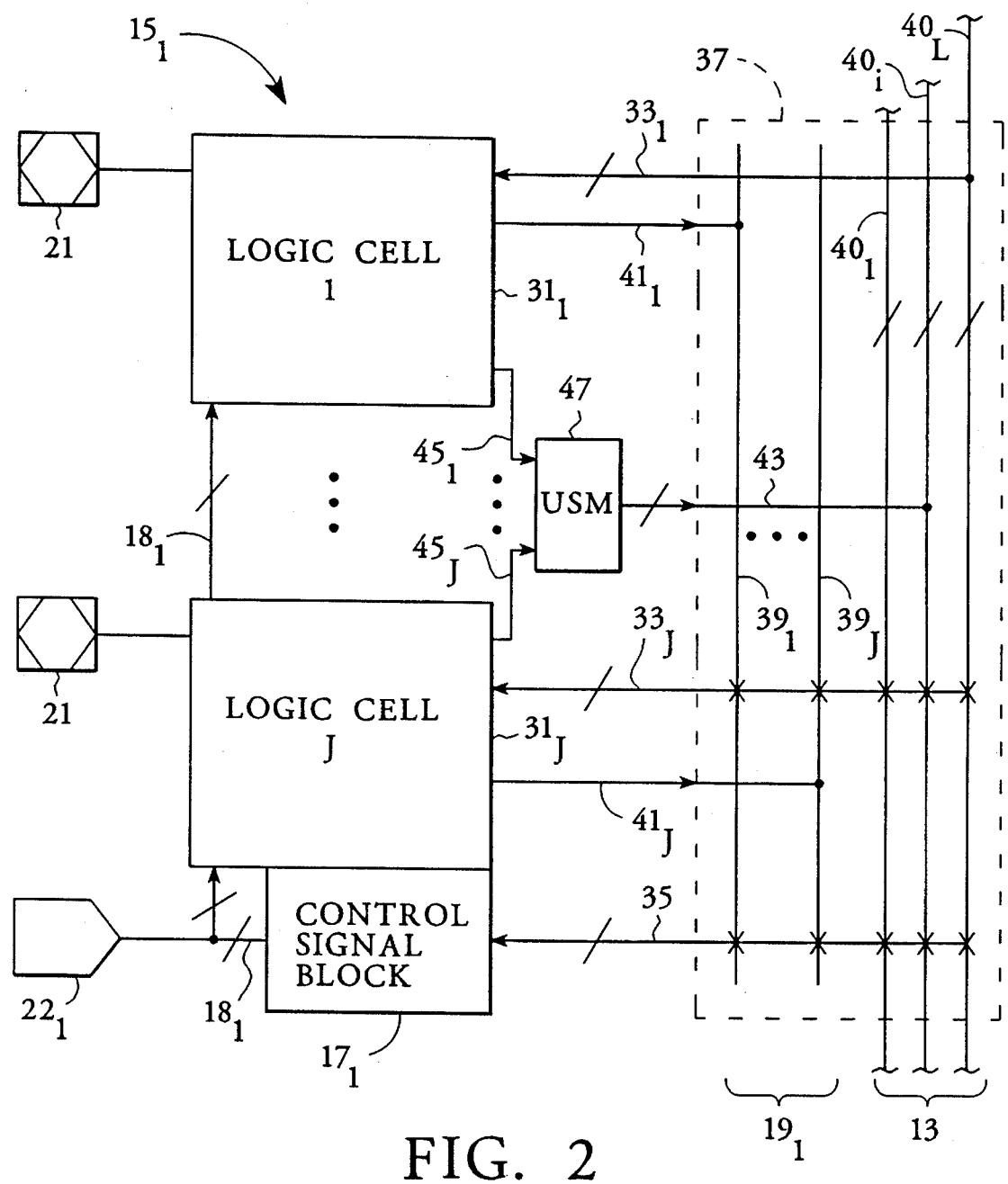
FIG. 2 is a block diagram showing details of one of the logic regions in the ultra PLD of FIG. 1.

With reference to FIG. 2, a typical logic region, for example the logic regional $11_1$ of FIG. 1 shown here, has a plurality J of logic cells $31_1$–$31_J$ arranged as a group $15_1$, input/output pins 21 associated with at least some of the logic cells $31_1$–$31_J$, a single control signal generating circuit block $17_1$ providing regional control signals on lines $18_1$ to the group $15_1$ of logic cells $31_1$–$31_J$ of the region $11_1$ and a regional signal bus $19_1$. Typically, there are about 20 logic cells $31_1$–$31_J$ in a logic region. Some logic cells are input/output (I/O) macrocells with an associated I/O pin 21, while other logic cells may be buried. Other than this difference, the logic cells $31_1$–$31_J$ are typically substantially identical to one another in construction. Each logic cell $31_1$–$31_J$ has a number of inputs connected to input lines $33_1$–$33_J$, typically about ten per logic cell, for receiving a corresponding number of input signals from the regional and universal buses $19_1$ and 13. The control signal generating circuit block $17_1$ also has a number of inputs connected to input lines 35, typically about six in number, for receiving a corresponding number of additional input signals from the regional and universal buses $19_1$ and 13. A typical logic region of twenty logic cells would thus have about 206 input lines $33_1$–$33_J$ and 35.

A crosspoint switch matrix 37 selects which bus lines $39_1$–$39_J$ and $40_1$–$40_L$ (including line $40_l$) connect to which input lines $33_1$–$33_J$ and 35 for each logic region. The crosspoint switch matrix 37 allows any signal in either bus (both regional bus $19_1$ and universal bus 13) to connect to any of the input lines $33_1$–$33_J$ and 35. However, while the same bus line may be connected to multiple input lines, each input line is allowed to connect to only one bus line. Connecting an input line to more than one bus line will short out the affected lines and lead to an indeterminate signal level. Further, while the signals within the universal bus 13 are available to input lines of all regions $11_1$–$11_N$, the signals in the regional bus $19_1$ are available only to the logic cells $31_1$–$31_J$ and control signal block $17_1$ in that particular logic region $11_1$. Signals in other regional buses $19_2$–$19_N$ are not available to the logic region $11_1$ but only to their associated region.

Each logic cell $31_1$–$31_J$ in the logic region routes one feedback signal on a regional feedback line $41_1$–$41_J$ directly to the regional bus $19_1$, with each feedback line $41_1$–$41_J$ fixedly connected to a designated regional bus line $39_1$–$39_J$ in one-to-one correspondence. Along with the J regional bus signals provided by the J logic cells $31_1$–$31_J$, each region's group $15_1$ of logic cells also generates a number of universal feedback signals, which are routed on universal feedback lines 43 to the universal bus 13. Each bundle of feedback lines 43 connects to a corresponding bundle of bus lines $40_i$ in the universal bus 13 with one feedback line fixedly connected in one-to-one fashion to one bus line. To generate these universal bus signals, each of the region's logic cells $31_1$–$31_J$ feeds one signal on lines $45_1$–$45_J$ to a universal switch matrix (USM) 47. The region's USM then selects a subset of the signals received from the logic cells $31_1$–$31_J$ for connection to the universal bus 13. Typically, about 40% of the received signals are selected, so that for a region having 20 logic cells, a typical USM would place eight of the signals onto the universal bus 13. Six signals might be selected from a region of fifteen or sixteen logic cells, eight from one of eighteen or twenty logic cells and ten from twenty-four logic cells. However, the percentage of signals selected for connection to the universal bus 13 is not absolutely critical, except that not more than about 75% of the received signals would normally be selected by a particular USM, unless the total number of logic cells in a region is small (twelve or less).

Figure 3B:
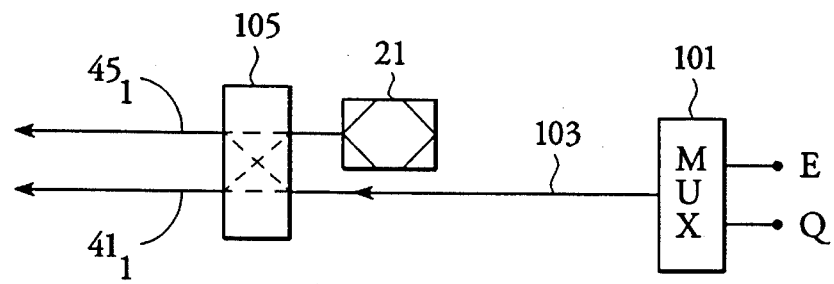
FIGS. 3a and 3b are block diagrams showing the gate-level structure of one of the logic cells in the logic region of FIG. 2.
Figure 3A:
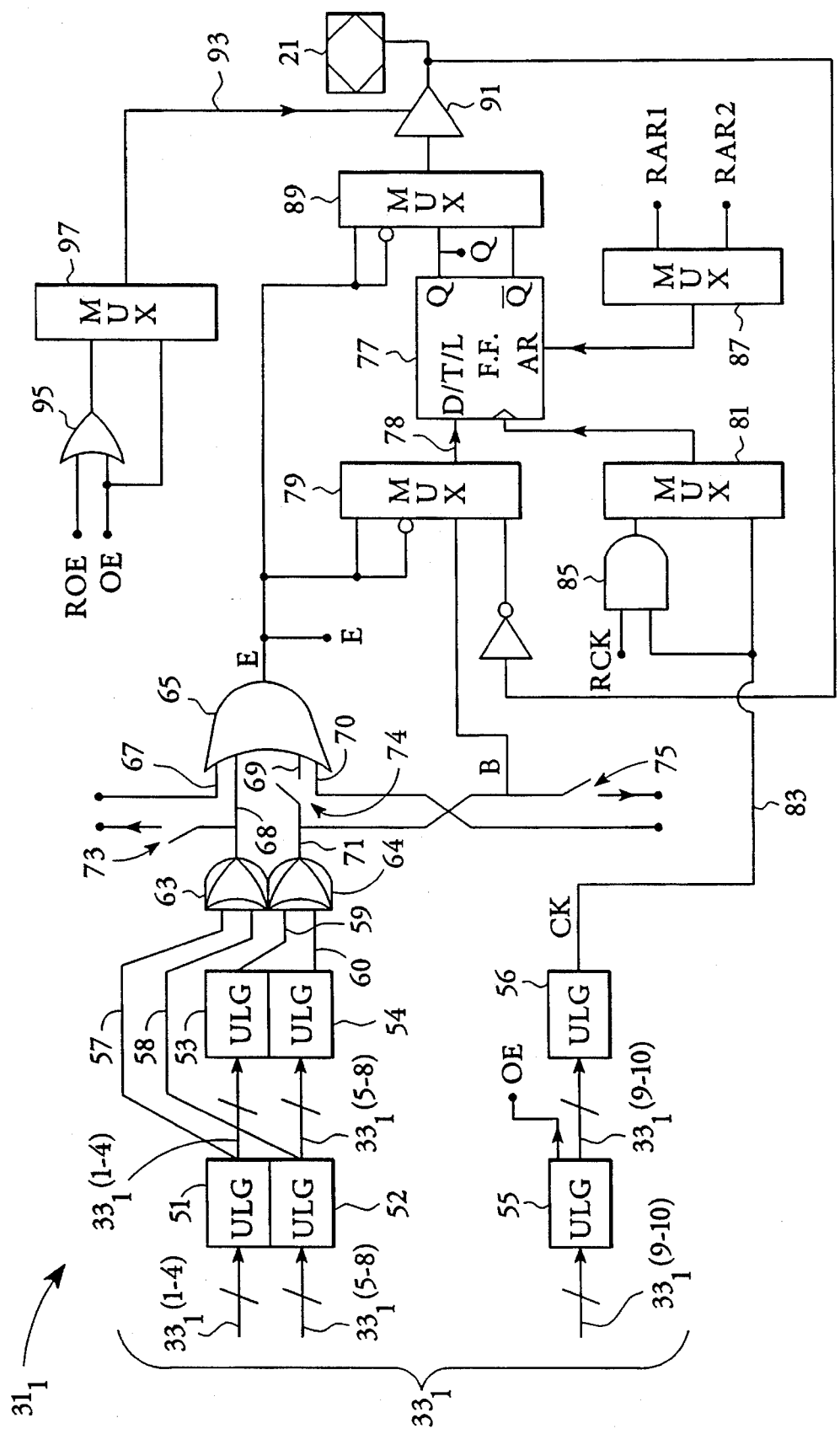

With reference to FIGS. 3a and 3b, each logic cell is either an I/O macrocell, like the logic cell $31_1$ of FIG. 3a shown here, or is a buried macrocell. Buried macrocells are similar to the I/O macrocell depicted in FIGS. 3a and 3b, except that they do not have an associated I/O pin 21. Circuit elements related to outputting signals on a pin or receiving input signals from an I/O pin are also absent in buried macrocells. In some ultra PLDs or some regions of such a device, all of the logic cells are I/O macrocells with an associated I/O pin, while other PLDs of the present invention have both I/O macrocells and buried macrocells.

As shown in FIG. 3a, each logic cell $31_1$ of the preferred device contains four 4-input universal logic gates (ULGs) 51–54 and two 2-input ULGs 55 and 56. Two of the 4-input ULGs 51 and 53 share the same four input lines $33_{1(1-4)}$ from the crosspoint switch matrix 37 shown in FIG. 2, the other two of the 4-input ULGs 52 and 54 of FIG. 3a share four other input lines $33_{1(5-8)}$, and the two 2-input ULGs 55 and 56 share the final two input lines $33_{1(9-10)}$. Each of the 4-input ULGs 51–54 can be separately programmed to generate any one of the $2^{16}$ Boolean logic functions of its four inputs. Likewise, each 2-input ULG 55 and 56 can be separately programmed to generate any one of the 16 possible Boolean logic functions of its two inputs.

The four 4-input ULG outputs 57–60 are used as inputs to two logic pairing gates 63 and 64. These pairing gates 63 and 64 can be programmably configured to act either as AND gates or as OR gates. A 4-input OR gate 65 follows the pairing gates 63 and 64. One input 68 of the OR gate 65 connects to the output of pairing gate 63. Another input 69 of the OR gate 65 is connectable, via a programmable switch 74, to the output 71 of the other pairing gate 64. Thus, OR gate 65 allows the two pairing gate outputs to be logically combined ('summed' or 'ORed') with each other. Pair gate outputs from adjacent logic cells may also be available to the OR gate 65 at its inputs 67 and 70. Likewise, the outputs of pairing gates 63 and 64 may be sent, through programmable switches 73 and 75 to adjacent logic cells. In this manner, adjacent logic cells may share or steal each others pairing gate outputs.

Each logic cell has one flip-flop $77_1$ which may be configured by programmable configuration bits therein (not shown) to act as either a D-type register, a T-type register, or a latch. The data input 78 to the flip-flop 77 is connected to the output of a multiplexer 79 with four inputs. Using this multiplexer 79, the input 78 to the flip-flop 77 may be selected to be either the output node E of OR gate 65, the complement of E, the output node B of pairing gate 64, or, in the case of I/O macrocells, the complement of the signal received at the I/O pin 21. Each flip-flop 77 has two clocking options, selectable by a configurable multiplexer 81. In one option, the clock can be the logic cell's own clock signal CK, generated within the logic cell by the 2-input ULG 56 and transmitted to an input of multiplexer 81 on clock line 83. Alternatively, the clock can be selected to be the logical product (the output of AND gate 85) of the internally generated clock signal CK and the region's synchronous clock signal RCK received at an external clock pin (pin $22_1$ in FIG. 2) assigned to that region, thereby allowing gated pin clocking. Also, by programming the clock generating ULG 56 to always output a logic 1 (one of the sixteen possible Boolean functions of a 2-input ULG), simple pin controlled clocking may be carried out. The flip-flop 77 uses either of two regional asynchronous reset control signals RAR1 and RAR2, selected by a programmably configurable multiplexer 87. The provision of two asynchronous reset signals RAR1 and RAR2 in each region allows a region's logic cells to be divided into two subgroups whose flip-flops are reset by distinct signals.

In the case of I/O macrocells, the logic cell can be configured by means of yet another multiplexer 89 to output either the combinatorial signal on node E, the register output Q from flip-flop 77, or the complements of either of these two signals. Each I/O macrocell also has a tri-statable output buffer 91 controlled by an output enable signal on line 93. The logic cell may select its own internal output enable signal OE generated by the 2-input ULG 55, using the same two inputs $33_{1(9-10)}$ as the clock generator 56, or the signal OE may be logically combined by an OR gate 95 with a regional output enable signal ROE generated by the control signal block $17_1$ in FIG. 2 and common to all of the I/O macrocells within the region. Selection of signal OE or the combined (OE+ROE) signal may be made by a configurable multiplexer 97.

The control signal generating circuit block $17_1$ in FIG. 2 generates the control signals RAR1 and RAR2 (asynchronous resets) and ROE (output enable) shown in FIG. 3a using three separate 2-input ULGs, not shown, each receiving two different inputs on input lines 35 from the crosspoint matrix 37 shown in FIG. 2.

As seen in FIG. 3b, the feedback select portion of the logic cell includes a multiplexer 101 which has an input connected to the node E at the output of OR gate 65 of FIG. 3a to receive a combinatorial signal and another input connected to the output Q of the flip-flop 77 to receive a registered signal. The multiplexer 101 of FIG. 3b selects either the combinatorial signal or the registered signal and provides this initial selection on its output 103 for possible feedback to the universal and regional buses. A second multiplexer 105 has an input connected to the I/O pin 21 to receive a pin signal and a second input which is connected to the output 103 of the first multiplexer 101 to receive the selected combinatorial or registered feedback signal. This second multiplexer 105 provides one of the two signals to the regional feedback line $41_1$ connected to a regional bus line and provides the other of the two signals on line $45_1$ to the universal select matrix (USM) 47 in FIG. 2 for possible connection to a universal bus line. Thus, the logic cells provide both regional and universal feedback options. As shown in FIG. 3b, the regional feedback on line $41_1$ may be programmed to be either the combinatorial signal on node E, the stored signal in flip-flop output Q or, in the case of I/O macrocells, the pin signal. One signal is also selected from each logic cell as a potential universal feedback on line $45_1$. Like the regional feedback, this potential universal feedback signal is selected from either the I/O pin signal or the combinatorial or registered signal initially selected by multiplexer 101. However, in this preferred implementation, the combinatorial and stored signals cannot both be used as feedbacks from a given logic cell. The selected potential universal feedback signal goes to the region's USM 47, seen in FIG. 2, which as previously described, maps a subset (e.g., eight out of twenty) of its input signals to its universal bus lines.

Figure 4:
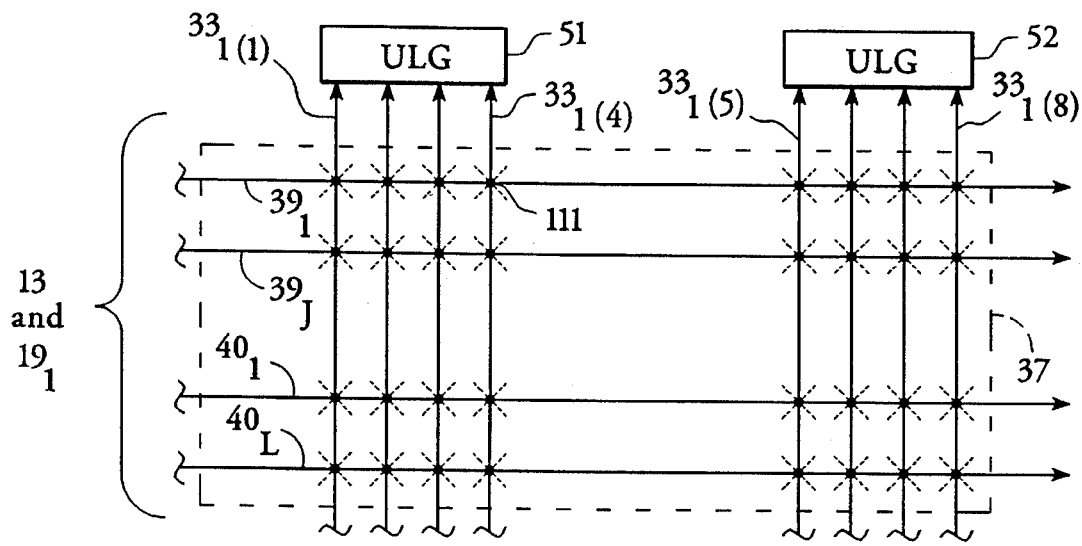
FIG. 4 is a simplified view of a portion of the crosspoint switch matrix of the ultra PLD of FIG. 1 connecting to the universal logic gates (ULGs) in the logic cell of FIG. 3.

With reference to FIG. 4, the crosspoint switch matrix 37 connects regional and universal bus lines $39_1$–$39_J$ and $40_1$–$40_L$, represented here by horizontal lines, to input lines, represented here by vertical lines corresponding to eight of the input lines $31_{1(1-8)}$. Two of the universal logic gates 51 and 52 of a logic cell are seen at the top of the Figure, each connected to four input lines $33_{1(1-4)}$ and $33_{1(5-8)}$. At the intersection of each bus line and logic cell input line is a crosspoint switch 111 that can be programmed to connect the two lines, and thereby allows a bus signal to be placed onto that input line. Each bus line $39_1$–$39_J$ and $40_1$–$40_L$ can be connected to one or more input lines $33_1$. However, only one bus line may be connected to any one input line. Any unused input lines may be programmed to a fixed state, either high or low as required by the particular function implemented by the ULG 51, 52, etc.

Figure 5:
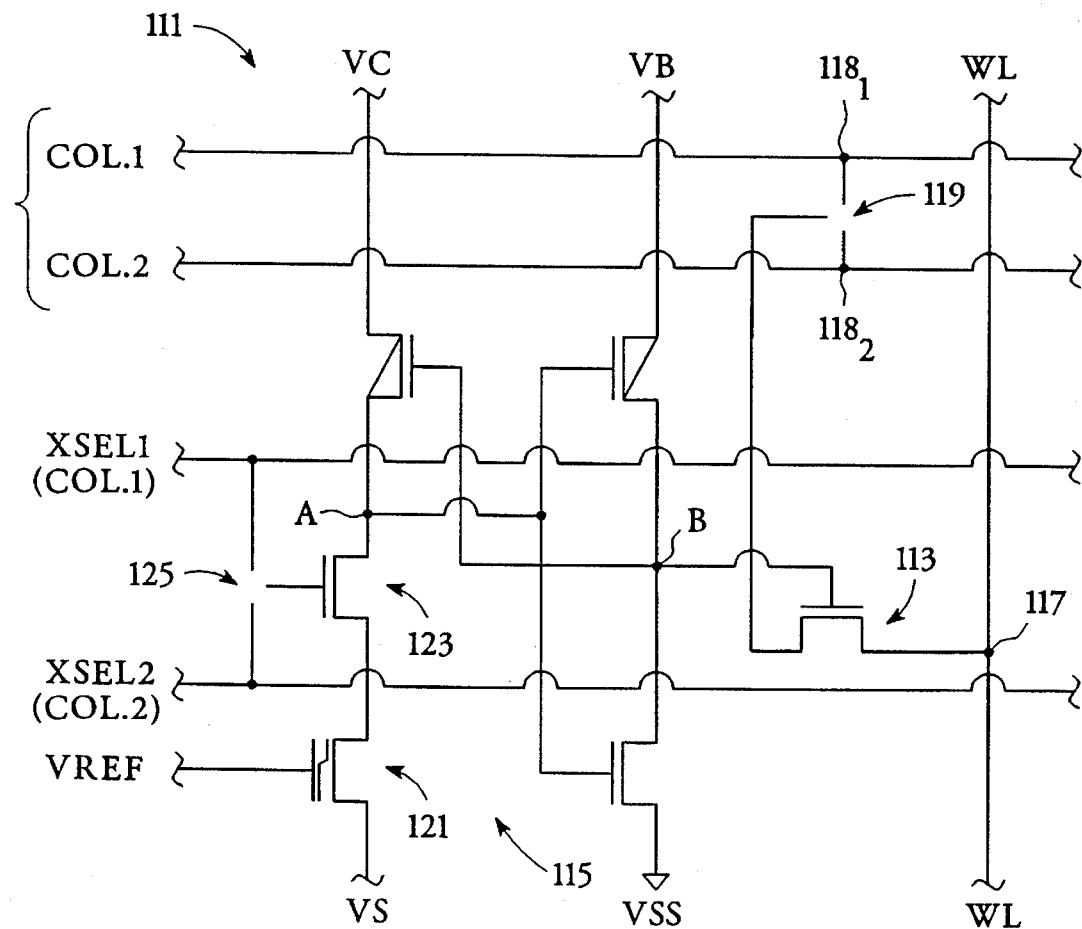
FIG. 5 is a schematic circuit diagram of one of the crosspoint switches in the matrix of FIG. 4.

As seen in FIG. 5, each crosspoint switch 111 is a transmission gate 113 controlled by an electrically erasable, nonvolatile latch 115. The line WL is a bus line, while the lines labeled COL1 and COL2 are two input lines. The transmission gate 113, here an n-channel field-effect transistor, has its source and drain terminals connected to the bus line WL at node 117 and to one of the input lines COL1 or COL2 at node $118_1$ or $118_2$. A mask programmed connection 119 determines which of the two logic cell input lines COL1 and COL2 is connected to the transmission gate 113. An adjacent crosspoint switch 111, not shown, has its transmission gate connected to the other input line via a similar mask programmed connection. The transmission gate 113 is controlled by an SRAM latch 115 with a nonvolatile programmable storage element 121, such as a floating-gate-type EEPROM, on one side. VREF is the sense line for the nonvolatile storage element 121. XSEL1 and XSEL2 are two select lines corresponding to the two logic cell input lines COL1 and COL2 connected to the select transistor 123 via the mask programmable connection 125. When input line COL1 is connected to the transmission gate 113, select line XSEL1 is connected to the select transistor 123. In an adjacent cell, COL2 and XSEL2 are connected. The select lines pulse to Vcc at power-up, then get held at a reference value (about 2 volts). The value stored in nonvolatile element 121 is read at node A, the drain of the select transistor 123. The control gate of transmission gate 113 is connected to the SRAM latch at node B.

In a write mode, VREF is first charged to a program voltage Vpp, with all other lines VC, VB, VS and XSEL held at ground, to charge up the floating gates of all nonvolatile storage elements 121. Then with VREF at ground, VC at program voltage Vpp, VB at ground and VS allowed to float, the floating gates are selectively discharged by holding XSEL at program voltage Vpp. Unselected storage elements 121 have XSEL at ground. In a read mode, VREF and VS are at ground, VC and VB are at a normal operating voltage Vcc, and XSEL is at Vcc for sense or 2 volts for holding the sensed value in the latch 115.

In a programmed logic pattern, each logic cell input has only one of its crosspoint latches 115 set. Connecting two bus lines WL simultaneously to a single logic cell input COL1 or COL2 shorts out the two bus lines because of the direct connection through the transmission gates 113, and thus leads to an indeterminate signal level and no useful connection. Accordingly, the crosspoint switch matrix 37 seen in FIGS. 2 and 4 should not be regarded as a logic element, since product terms cannot be formed by multiple bus connections to a single input line. Rather, the switch matrix 37 merely acts to route a bus signal to one or more logic cell inputs.

We claim:

1. A programmable logic device (PLD), comprising
   a plurality of logic cells receiving input signals through logic cell inputs, said logic cells arranged in groups defining separate logic regions of such cells,
   a plurality of bus lines for conducting signals thereon, and
   a crosspoint switch matrix programmably connecting bus lines to said logic cell inputs, each logic cell input being programmably connectable via a set of crosspoint switches of said matrix to at most one of any one of a plurality of said bus lines, each crosspoint switch being located at each intersection of said logic cell inputs and said bus lines and including a transmission gate connected from one of said bus lines to one of said logic cell inputs, said transmission gate being controlled by a programmable nonvolatile latch, each bus line being connectable to the logic cell inputs of the logic cells of at least one of said logic regions, at least one bus line being a regional bus line connectable only to logic cell inputs of the logic cells in only one of said logic regions and at least one bus line being a multi-regional bus line connectable to logic cell inputs of logic cells in multiple logic regions, each said regional bus line being directly connectable to logic cell inputs of all of the logic cells of a logic region.

2. The PLD of claim 1 wherein at least one multi-regional bus line is a universal bus line directly connectable to logic cell inputs of logic cells in every logic region.

3. A programmable logic device (PLD), comprising
   a plurality of logic cells receiving input signals through logic cell inputs, said logic cells arranged in groups defining separate logic regions of such cells,
   a plurality of bus lines for conducting signals thereon, and
   a crosspoint switch matrix programmably connecting bus lines to said logic cell inputs, each logic cell input being programmably connectable via a set of crosspoint switches of said matrix to any one of a plurality of said bus lines but capable of being usefully connected without shorting to at most one of said bus lines, each crosspoint switch including a transmission gate connected from one of said bus lines to one of said logic cell inputs, said transmission gate being controlled by a programmable nonvolatile latch, each bus line being connectable to the logic cell inputs to the logic cells of at least one of said logic regions, at least one bus line being a regional bus line connectable only to logic cell inputs of the logic cells in only one of said logic regions and at least one bus line being a multi-regional bus line connectable to logic cell inputs of logic cells in multiple logic regions, each logic cell providing a regional feedback signal to a regional bus line.

4. A programmable logic device (PLD), comprising
   a plurality of logic cells receiving input signals through logic cell inputs, said logic cells arranged in groups defining separate logic regions of such cells,
   a plurality of bus lines for conducting signals thereon, and
   a crosspoint switch matrix programmably connecting bus lines to said logic cell inputs, each logic cell input being programmably connectable via a set of crosspoint switches of said matrix to any one of a plurality of said bus lines but capable of being usefully connected without shorting to at most one of said bus lines, each crosspoint switch including a transmission gate connected from one of said bus lines to one of said logic cell inputs, said transmission gate being controlled by a programmable nonvolatile latch, each bus line being connectable to the logic cell inputs to the logic cells of at least one of said logic regions, at least one bus line being a regional bus line connectable only to logic cell inputs of the logic cells in only one of said logic regions and at least one bus line being a multi-regional bus line connectable to logic cell inputs of logic cells in multiple logic regions, each logic cell providing a multi-regional feedback signal to a multi-regional bus line.

5. The PLD of claim 4 further comprising a plurality of select means, each associated with a different logic region and receiving a potential multi-regional feedback signal from each logic cell of that logic region, for selecting a subset of said potential multi-regional feedback signals from their respective associated logic regions and connecting said selected subset of signals to corresponding multi-regional bus lines.

6. The PLD of claim 4 wherein each logic cell both provides a regional feedback signal to a regional bus line and programmably provides a multi-regional feedback signal to a multi-regional bus line, each logic cell further having programmable switch means therein receiving two feedback signals for selecting one signal as said regional feedback signal and the other signal as said multi-regional feedback signal.

7. A programmable logic device (PLD) comprising
   a plurality of logic cells receiving input signals through logic cell inputs, said logic cells arranged in groups defining separate logic regions of such cells,
   a plurality of bus lines for conducting signals therein,
   a crosspoint switch matrix programmably connecting bus lines to said logic cell inputs, each bus line being connectable via a set of crosspoint switches of said matrix to the logic cell inputs of at least one logic region, a plurality of said bus lines being multi-regional bus lines connectable to logic cell inputs in multiple logic regions, some of said bus lines are regional bus lines, each connectable to logic cell inputs in only one logic region, and wherein each logic cell provides a regional feedback signal to one of said regional bus lines, and
   a plurality of feedback select matrices, one for each logic region, each select matrix having inputs receiving potential multi-regional feedback signals from said logic regions of its corresponding logic region and having outputs providing a programmably selected subset of said potential multi-regional feedback signals to said multi-regional bus lines.

8. The PLD of claim 7 wherein at least one multi-regional bus line is a universal bus line connectable to logic cell inputs in every logic region.

9. The PLD of claim 7 wherein each logic cell has programmable switch means receiving two feedback signals at switch inputs for selecting one of said feedback signals as a regional feedback signal provided at a first switch output to one of said regional bus lines and selecting the other of said feedback signals as a potential multi-regional feedback signal provided at a second switch output to the feedback select matrix corresponding to the logic region of said logic cell.

* * * * *